United States Patent [19]

Tamura et al.

[11] Patent Number: 5,556,204
[45] Date of Patent: Sep. 17, 1996

[54] METHOD AND APPARATUS FOR DETECTING THE TEMPERATURE OF A SAMPLE

[75] Inventors: Naoyuki Tamura, Yamaguchi-ken; Manabu Edamura, Ibaraki-ken; Kazue Takahashi, Yamaguchi-ken, all of Japan

[73] Assignee: Hitachi, Ltd., Tokyo, Japan

[21] Appl. No.: 246,300

[22] Filed: May 19, 1994

Related U.S. Application Data

[63] Continuation-in-part of Ser. No. 724,801, Jul. 2, 1991, Pat. No. 5,320,982.

[30] Foreign Application Priority Data

Jul. 2, 1990 [JP] Japan ................................. 2-172757
May 19, 1993 [JP] Japan ................................. 5-116965

[51] Int. Cl.$^6$ ............................. G01K 11/32; G01K 11/20
[52] U.S. Cl. ................... 374/161; 250/458.1; 250/459.1; 250/234; 250/578.1
[58] Field of Search ............................. 374/161, 208, 374/131; 250/234, 458.1, 578.1, 459.1

[56] References Cited

U.S. PATENT DOCUMENTS

| | | | |
|---|---|---|---|
| 3,751,305 | 8/1973 | Huebscher | 374/208 |
| 4,408,827 | 10/1983 | Guthrie et al. | 374/131 |
| 4,770,544 | 9/1988 | Mossey | 374/131 |
| 4,776,827 | 10/1988 | Greaves | 374/161 |
| 4,845,647 | 7/1989 | Dils et al. | 374/131 |
| 4,997,286 | 3/1991 | Fehrenbach et al. | 374/161 |
| 5,304,795 | 4/1994 | Fujihira et al. | 250/234 |
| 5,352,040 | 10/1994 | Mihalczo et al. | 374/161 |

FOREIGN PATENT DOCUMENTS

| | | | |
|---|---|---|---|
| 0218482 | 5/1968 | U.S.S.R. | 356/45 |
| 1522610 | 8/1978 | United Kingdom | 374/131 |
| 8200712 | 3/1982 | WIPO | 374/131 |

*Primary Examiner*—Diego F. F. Gutierrez
*Attorney, Agent, or Firm*—Antonelli, Terry, Stout & Kraus

[57] ABSTRACT

This invention relates to a vacuum processing method and apparatus. When a sample is plasma processed under a reduced pressure, a sample bed is cooled by a cooling medium kept at a predetermined temperature lower than an etching temperature, the sample is held on the sample bed, a heat transfer gas is supplied between the back of the sample and the sample installation surface of the sample bed, and the pressure of the heat transfer gas is controlled so as to bring the sample to a predetermined processing temperature. In this way, a sample temperature can be regulated rapidly without increasing the scale of the apparatus. The temperature of the sample can be detected by a detector including a movable optical fiber having one end at which a phosphor is mounted and another end for transferring the fluorescence from the phosphor, a fixed optical transfer member provided apart from the another end of the movable optical fiber for receiving the fluorescence, a detector for detecting the temperature based on the fluorescence received by the fixed optical transfer member, and an actuating member for moving the movable optical fiber to provide thermal contact between the sample and the phosphor.

4 Claims, 5 Drawing Sheets

METHOD AND APPARATUS FOR DETECTING THE TEMPERATURE OF A SAMPLE

CROSS-REFERENCE TO RELATED APPLICATION

This application is a continuation-in-part of application Ser. No. 07/724,801, filed Jul. 2, 1991, now U.S. Pat. No. 5,320,982.

BACKGROUND OF THE INVENTION

1. Field of the Invention

This invention relates to a method and apparatus for vacuum processing. More particularly, the present invention relates to a method and apparatus for vacuum processing which is suitable for controlling a sample such as a semiconductor device substrate to different temperatures and vacuum processing the sample.

2. Description of the Prior Art

As disclosed in, for example, Japanese Patent Laid-Open No. 76876/1984, a conventional technology for vacuum-processing a sample by controlling it to different temperatures is such that an object (hereinafter referred to as a "substrate") to be etched is placed on an electrode disposed in a vacuum vessel, a reactive gas is introduced into the vacuum vessel, a voltage is applied to the electrode so as to generate gas discharge and the substrate is etched by this discharge gas at two or more different electrode temperatures.

In the prior art technology described above, a substrate temperature (to 60° C. in this prior art technology) is raised in view of the etching selection ratio of $MoSi_2$ to a resist and of producibility when an $MoSi_2$ film is etched, and the substrate temperature (to 30° C. in this prior art technology) is lowered in view of over-etching. In this prior art technology, the electrode is divided into an electrode on a high temperature side and another on a low temperature side. Etching of the substrate is carried out on the higher temperature electrode side, and after this etching, the substrate is transferred to the lower temperature electrode, and over-etching of the substrate is carried out. Alternatively, only one electrode is provided and the electrode temperature can be changed to high and low temperatures while the substrate is kept placed on the same electrode. The substrate temperature is raised to a high temperature to conduct its etching during processing and is lowered to achieve over-etching of the substrate after the etching.

SUMMARY OF THE INVENTION

In the prior art technology described above, the time necessary for raising the substrate temperature to two or more different temperatures and reduction of the scale of the apparatus have not been considered. In other words, if a plurality of electrodes are used, the apparatus becomes greater in scale because of the increase in the number of electrodes. Moreover, the time for attaining a predetermined processing condition or a predetermined temperature becomes long. A long time is necessary, too, in order to change the electrode temperature to predetermined temperatures using a single electrode because the heat capacity of this electrode is great.

One of the references concerning the present invention is U.S. Pat. No. 4,261,762.

In an apparatus for processing a sample under a reduced pressure, so as to rapidly regulate a sample temperature without increasing the scale of the apparatus, the apparatus in accordance with the present invention includes means for cooling a sample bed by a cooling medium kept at a predetermined temperature lower than an etching temperature, means for holding the sample on a sample installation surface of the sample bed, and means for supplying a heat transfer gas into the gap between the back of the sample held on the sample installation surface and the sample installation surface of the sample bed and controlling the pressure of the heat transfer gas in accordance with a predetermined processing temperature of the sample. In a method of processing a sample under a reduced pressure, the vacuum processing method in accordance with the present invention includes the steps of cooling a sample bed by a cooling medium kept at a predetermined temperature lower than an etching temperature, holding the sample on a sample installation surface of the sample bed, supplying a heat transfer gas into the gap between the back of the sample held on the sample installation surface and the sample installation surface of the sample bed so as to control the pressure of the heat transfer gas in accordance with a predetermined processing temperature of the sample, and processing the sample controlled to the predetermined temperature.

DESCRIPTION OF THE PREFERRED EMBODIMENTS

Figure 1:
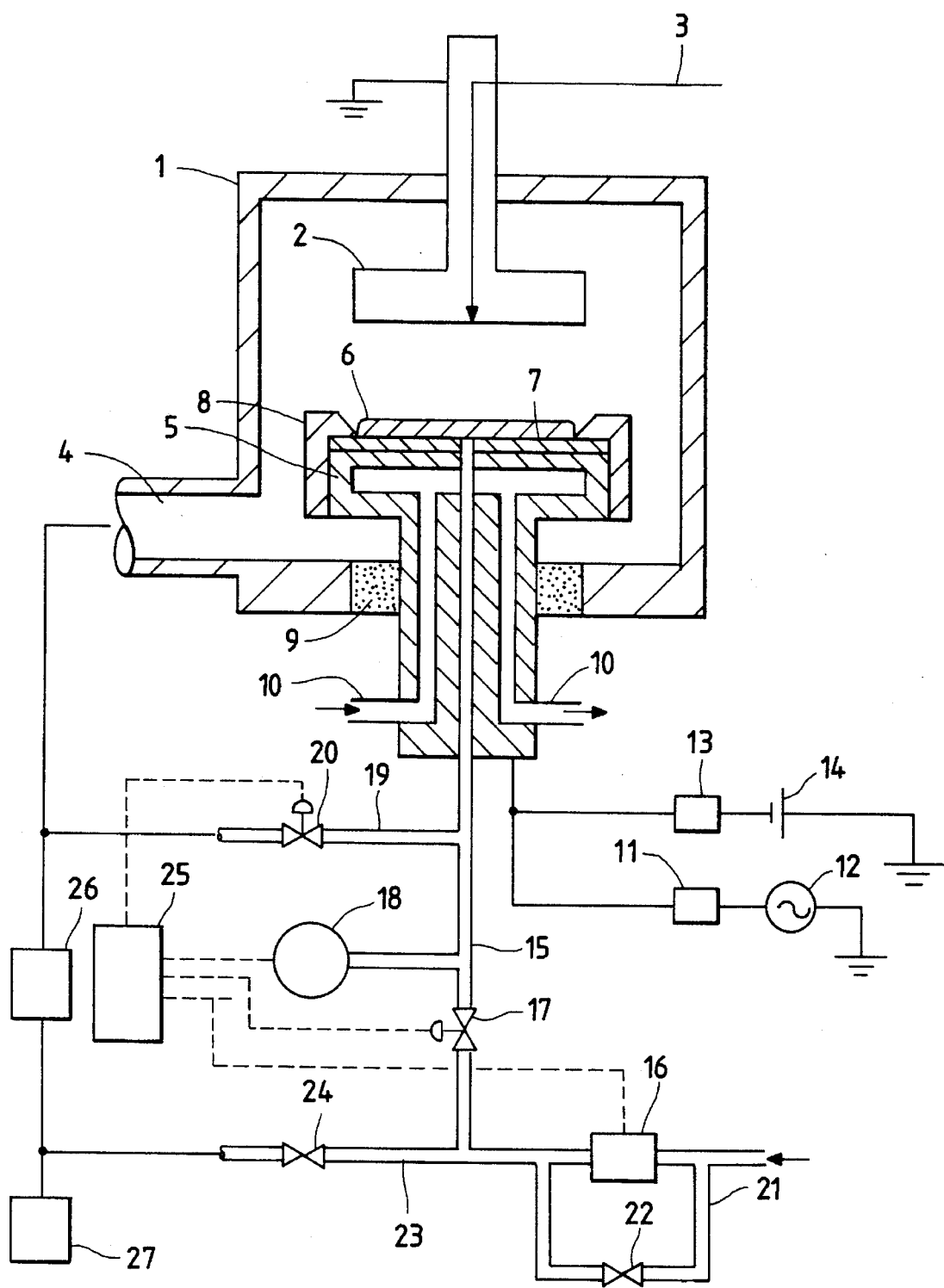
FIG. 1 is a structural view showing a microwave etching apparatus of an embodiment of a vacuum processing apparatus of the present invention.

A sample bed is cooled by a cooling medium kept at a predetermined temperature lower than a processing temperature. A sample is held on a sample installation surface of the cooled sample bed by an electrostatic chuck, or the like. The temperature of the sample thus held is controlled to a predetermined processing temperature in the following way.

A heat transfer gas having a high thermal conductivity such as helium gas (GHe), etc, is supplied between the sample installation surface of the sample bed and the back of the sample. When this gas is supplied, the gas pressure between the sample installation surface and the back of the sample rises. The gas pressure is regulated by regulating the quantity of the heat transfer gas supplied and is kept stably under a gas pressure at which the sample temperature is kept at the predetermined processing temperature.

When the processing temperature of the sample is to be lowered, for example, the quantity of the heat transfer gas supplied is further increased. Accordingly, the gas pressure in the space between the sample installation surface and the back of the sample becomes higher than the gas pressure that corresponds to the initial processing temperature. Thus, the number of molecules that transfer heat becomes great and the sample can be cooled more effectively. The gas pressure is regulated to the one corresponding to the subsequent processing temperature.

When the processing temperature of the sample is to be raised, on the contrary, the quantity of the heat transfer gas supplied is reduced, so that the gas pressure in the space between the sample installation surface and the back of the sample falls below the one that corresponds to the initial processing temperature. In this way, the number of gas molecules that transfer heat becomes small and the drop of temperature of the sample can be restrained. This gas pressure is regulated to the one corresponding to the subsequent processing temperature.

In this case, in order to improve the follow-up property of the sample temperature, the heat transfer gas between the sample installation surface of the sample bed and the back of the sample is exhausted and the supply of the heat transfer gas is stopped or the quantity of the supplied gas is reduced. In this way, the gas pressure in the space between the sample installation surface and the back of the sample drops more rapidly. Thereafter, the exhaust of the heat transfer gas between the sample installation surface and the back of the sample is stopped.

As described above, while the sample is held on the sample installation surface of the sample bed, that is, while the gap between the sample installation surface and the back of the sample is kept small (or in other words, in a state where the gap is kept smaller than the mean free path of the heat transfer gas), the coefficient of heat transfer between the sample and the sample bed can be changed by changing the gas pressure of the heat transfer gas in this gap, and only the sample temperature can be rapidly varied to a different temperature while the temperature of the sample bed is kept as such.

Figure 2:
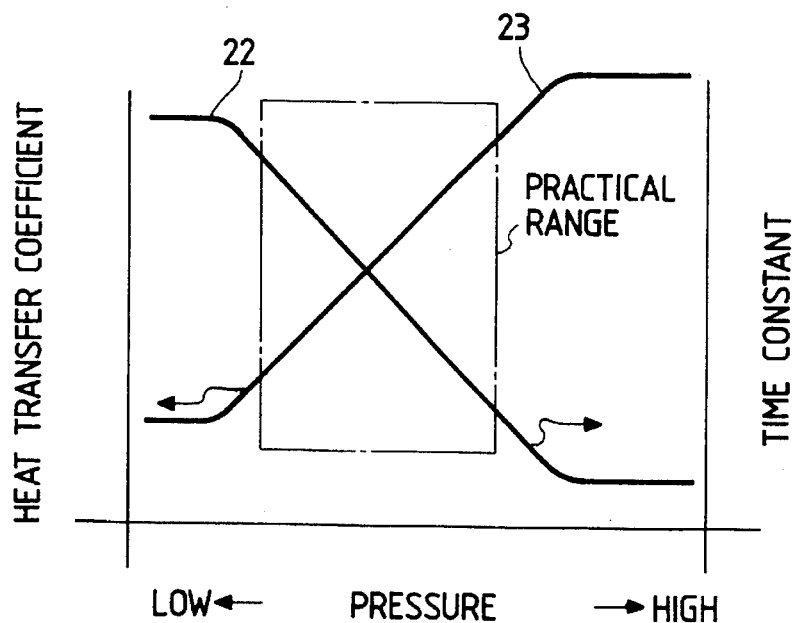
FIG. 2 is a diagram showing the relation between the pressure of a heat transfer gas and the heat transfer coefficient of the heat transfer gas and the relation between heat transfer gas pressure and the time constant, when a sample is held on a sample bed by electrostatic chuck.

Hereinafter, an embodiment of the present invention will be described with reference to FIGS. 1 and 2. FIG. 1 shows a parallel flat plate type dry etching apparatus in this case.

A sample bed 5 for placing a sample 6 thereon is disposed at a lower part of a vacuum processing chamber 1. The sample bed 5 is electrically insulated from the vacuum processing chamber 1 by a dielectric member 9. A dielectric film 7 is formed on the upper surface of the sample bed 5. The sample 6 is placed on or removed from the sample bed 5 by a conveyor device not shown in the drawing. The sample 6 is placed on the sample bed 5 through the dielectric film 7. An insulating ring 8 is disposed on the part surrounding the sample 6 and on the side surface of the sample bed 5 in such a manner as to cover these portions. An upper electrode 2 is disposed inside the vacuum processing chamber 1 so as to face the sample bed 5. A gas introduction passage for introducing a processing gas into the vacuum chamber 1 through a gas introduction pipe 3 is formed in the upper electrode 2. An evacuator (in this case, this evacuator comprises a turbo molecular pump 26 and a mechanical booster pump 27) for decompressing and exhausting the inside of the vacuum processing chamber 1, is connected to the vacuum processing chamber 1 through an exhaust port 4 disposed on the side surface of the vacuum processing chamber 1.

A high frequency power supply 12 is connected to the sample bed 5 through a matching circuit 11 and a D.C. power supply 14 is likewise connected to the sample bed 5 through a high frequency cutoff circuit 13.

A flow passage for circulating a cooling medium is defined inside the sample bed 5, and a pipe 10 for transferring the cooling medium between the sample bed and a temperature regulator not shown in the drawing is connected to this flow passage. This circulated heat medium is controlled to a predetermined temperature and is sent to the sample bed 5.

A flow passage of the heat transfer gas is formed in this sample bed 5 in such a manner as to pass through the sample bed 5 and the dielectric film 7, and a heat transfer gas supply line 15 is connected to this flow passage. The heat transfer gas such as He gas is supplied under the back of the sample 6 on the dielectric film 7 through a flow rate regulator 16 and a supply valve 17 that are disposed in this heat transfer gas supply line 15. A portion of the dielectric film 7, on which the sample 6 is placed, is provided with a groove that makes the passage of the heat transfer gas easy. This groove is disposed in an area which does not reach the periphery of the sample 6. Accordingly, the pressure of the heat transfer gas under the back of the sample 6 is substantially equal to the pressure of the heat transfer line 15. It is preferable that the heat transfer gas pressure on the back of the sample be higher than the pressure in the vacuum processing chamber 1 so as to provide a pressure difference. The heat transfer gas supplied through the heat transfer gas line 15 passes through the gap between the sample 6 and the sample installation surface of the sample bed 5, in other words, through the gap between the back of the sample 6 and the dielectric film 7 formed on the sample bed 5, and finally flows into the vacuum processing chamber 1 and is exhausted.

An absolute pressure vacuum gauge 18 is provided in the heat transfer gas line 15 between the sample 6 and the supply valve 17, and a heat transfer gas exhaust line 19 is also connected between them. The heat transfer gas line 19 is provided with an exhaust valve 20, and is connected, in this case, to the evacuator for decompressing and exhausting the inside of the vacuum processing chamber 1.

A controller 25 is connected to the absolute pressure vacuum gauge 18 so that the pressure of the vacuum gauge 18 can be monitored, and is connected also to the flow rate regulation valve 16, the supply valve 17 and the exhaust valve 20 so that it can control them, respectively. The controller 25 stores the relation between the heat transfer gas pressure and the sample temperature and can control the flow rate regulator 16, the supply valve 17 and the exhaust valve 20 by the pressure of the heat transfer gas supply line 15 measured by the absolute pressure vacuum gauge 18. The relation between the heat transfer gas pressure and the sample temperature that is stored in the controller 25 is the value which is obtained by making examination in advance and, in this case, which is obtained by cooling the sample bed 5 by a cooling medium at a predetermined temperature, and holding the sample 6 on the cooled sample bed 5 and supplying the heat transfer gas under the back of the sample 6.

Reference numeral 21 represents a bypass line for the bypass of the flow rate regulator 16; 22 is a valve disposed in the bypass line 21; 23 is an exhaust line connected between the supply valve 17 of the heat transfer gas supply line 15 and the flow rate regulator 16; and 24 is a valve disposed in the exhaust line 23. The bypass line 21 and the exhaust line 23 are disposed in order to exhaust the heat transfer gas remaining in the heat transfer gas supply line 15 between the main valve of a heat transfer gas supply source (not shown in the drawing) and the supply valve 17 when the operation of the apparatus is stopped.

The apparatus thus constructed is used in the following way. The sample 6 is placed on the sample bed 5 by the conveyor device not shown in the drawing. A processing gas is supplied at a predetermined flow rate into the vacuum processing chamber 1 through the gas introduction pipe 3. The vacuum processing chamber 1 is evacuated by the evacuator from the exhaust port 4 and the pressure in the vacuum processing chamber 1 is controlled to a predetermined degree of vacuum by an absolute pressure vacuum gauge (not shown) disposed in the vacuum processing chamber and a control valve (not shown) disposed in the exhaust system. Thereafter, high frequency power is supplied by the high frequency power supply 12 to the sample bed 5 through the matching circuit 11, and D.C. power is supplied too, by the D.C. power supply 14 to the sample bed 5 through the high frequency cutoff circuit 13. When this high frequency power is applied, discharge takes place inside the vacuum processing chamber 1 and the processing gas is converted to plasma, so that etching of the sample 6 is started.

When D.C. voltage is applied, an electrostatic attracting force takes place and the sample 6 is held on the dielectric film 7. After the sample 6 is held by the sample bed 5 through the dielectric film 7, the heat transfer gas is supplied under the back of the sample 6 through the heat transfer gas supply line 15. The sample bed 5 is cooled by a cooling medium kept at a predetermined temperature. Accordingly, the heat input to the sample 6 by the plasma processing is transferred to the sample bed 5 through the heat transfer gas on the back of the sample 6 and through the dielectric film 7 and is removed by the temperature regulator (not shown in the drawing) through the cooling medium circulating through the sample bed 5.

When the sample 6 is electrostatically held as in this embodiment, the gap between the sample 6 and the dielectric film 7 can be made sufficiently small. Accordingly, the heat transfer gas under the back of the sample 6 can be within the pressure range of from about 1 Torr to around 10 Torr. In other words, the major proportion of the gap (except for the groove, and the like) between the back of the sample 6 and the upper surface of the dielectric film 7 are narrower than the mean free path of the heat transfer gas and the gap of such portions is a molecular flow region of the heat transfer gas. Therefore, the quantity of heat transfer is determined by the number of molecules of the heat transfer gas, that is, by the pressure of the heat transfer gas, and the heat transfer coefficient is approximately proportional to the heat transfer gas pressure on the back of the sample 6 as shown in FIG. 2.

Accordingly, though depending on the performance of the heat regulator when the temperature of the sample bed 5 is lowered beforehand by the maximum capacity of the temperature regulator, the temperature of the sample bed 5 has the following relation with the quantity of heat inputted to the sample 6:

(quantity of heat inputted to sample 6) =

(heat transfer coefficient of heat transfer gas under back of sample 6) × (temperature of sample 6 − temperature of sample bed 5)

where the difference between temperatures of the dielectric film 7 formed on the sample bed 5 and the sample bed 5 can be neglected.

The temperature of the sample can be controlled appropriately by using the relation between the heat transfer gas under the back of the sample and the heat transfer coefficient. When, for example, the sample 6 is processed while the sample bed 5 is cooled by a cooling medium at −60° C. and the sample 6 is cooled to −30° C., this processing is carried out in the following way. The measured values and proportional expression are experimentally determined and stored in the controller 25 beforehand. The flow rate regulator 16 is controlled by the controller 25, while the value of the pressure measured by the absolute pressure gauge 18 is read, so that the pressure of the heat transfer gas supplied from the heat transfer gas supply line 15 may be equal to the one corresponding to the temperature of the sample, that is, −30° C., in this case. Thus, the pressure is set to the predetermined pressure value by regulating the heat transfer gas flow rate. In this manner, the sample 6 is controlled to the set temperature.

The result of the experiment shows that the heat transfer coefficient was from about 50 to about 500 and the time constant was from 20 to about 2 seconds when the heat transfer gas pressure on the back was from 1 to 10 Torrs. When the sample temperature is changed during processing, about 70% of the desired temperature can be accomplished in a time which is approximately the sum of the control time of the pressure plus the time constant. Therefore, when the sample temperature is to be controlled to a lower temperature, so as to change rapidly the sample temperature to a desired temperature, taken is a method of closing the exhaust valve 20 by the controller 25, opening the supply valve 17 so as to pass the heat transfer gas from the flow rate controller 16 at a maximum flow rate, speeding up the rise of the pressure of the heat transfer gas under the back of the sample 6 and increasing the heat transfer quantity. (Ordinarily, the valves 22 and 24 are kept closed.) Thereafter, the pressure of the heat transfer gas is returned to the predetermined pressure and is stabilized. In this manner, the sample temperature can be rapidly lowered to the predetermined temperature. When the sample 6 is changed to a further lower temperature after the processing performed at this temperature or at a certain time during this processing, the same operation as described above is carried out and the pressure is stabilized to the predetermined one corresponding to the lower temperature.

When the sample temperature is to be adjusted to a higher temperature, on the contrary, the pressure of the heat transfer gas under the back of the sample 6 must be lowered. However, it is not easy to do so since the pressure of the heat transfer gas under the back of the sample 6 electrostatically held hardly lowers because the gap between the back of the sample 6 and the dielectric film 7 is small and the gas in the gap cannot escape easily. For this reason, even if the supply of the heat transfer gas is stopped, the pressure drop is small. Accordingly, the flow rate regulator 16 decreases the flow of the gas by the operation of the controller 25 and the heat transfer gas in the heat transfer gas supply line 15 is once exhausted by opening the exhaust value 20. Then, the heat transfer gas is supplied at a flow rate where the predetermined pressure is attained and is kept stably under a lower pressure. In this manner, the sample temperature can be rapidly raised to the predetermined one. In this case, the temperature is raised by use of the heat input to the sample 6.

The control operation described above can control arbitrarily and rapidly the temperature of the sample 6, even during the processing of the sample, by controlling the pressure of the heat transfer gas under the back of the sample 6 without changing the temperature of the sample bed.

Since the temperature of the sample can be controlled rapidly during processing as described above, the selection ratio of the etched material to the base can be increased by lowering the temperature of the sample, for example, near the end of etching, if a large selection ratio is required at that point.

In the embodiment described above, the sample temperature can be controlled more and sufficiently rapidly than the conventional technique in which the temperature of the sample bed is changed during the processing. Therefore, the present invention will be suitable for sheet-type dry etching for fabricating more miniaturized integrated circuitry by the use of a low temperature technique.

Since the temperature can be controlled quickly, and there is no need to carry out the processing on a plurality of sample beds having mutually different temperatures, the sample conveying time unnecessary and the through-put can therefore be improved. Since the numbers of sample beds and cooling devices are small, the scale of the apparatus is small and the apparatus is more economical.

The present invention is not particularly limited to the embodiment given above but can be applied suitably to the following cases:

(1) The case where vacuum processing is carried out by changing and controlling the sample temperature. Here, the term "vacuum processing" includes not only processing such as an etching by use of plasma, CVD processing, cleaning processing, ashing processing, corrosion-proofing processing and sputtering processing but also vacuum processing which do not utilize plasma such as ion implantation processing, vacuum deposition processing, and MBE processing.

(2) The case where the samples which are processed at different temperatures are placed sequentially on the same sample bed and are subjected continuously to vacuum processing. For example, the sample is subjected to high precision plasma etching below a μm order at different temperatures below 0° C.

Figure 3:
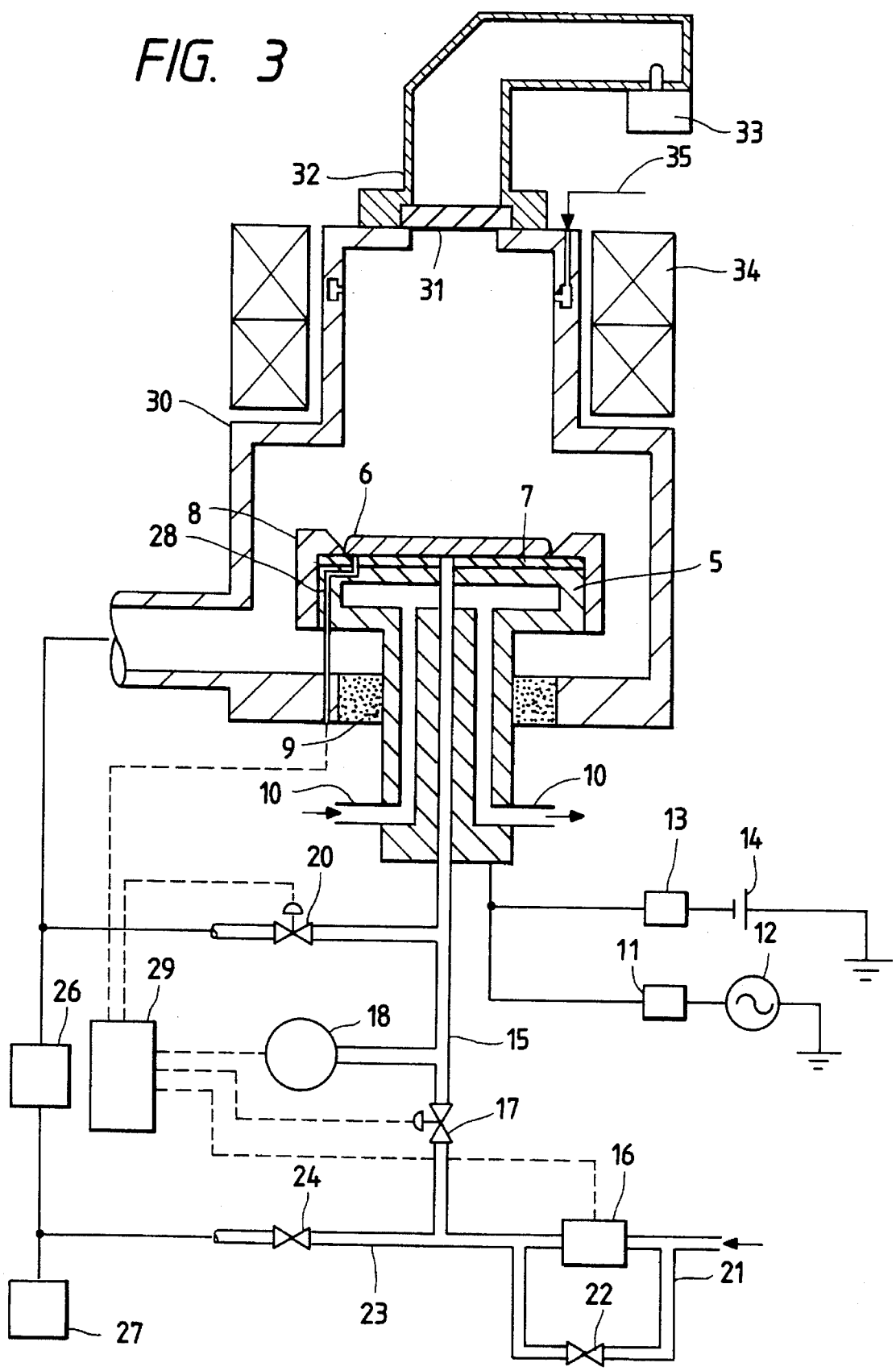
FIG. 3 is a structural view showing a parallel sheet-type dry etching apparatus as another embodiment of the vacuum processing apparatus of the invention.

Next, another embodiment of the present invention will be explained with reference to FIGS. 3 and 4. FIG. 3 shows in this case a microwave plasma etching apparatus.

In these drawings, like reference numerals are used to identify like constituent members as in FIG. 1 and the explanation of such members will be omitted. The differences between these drawings and FIG. 1 are that a microwave is used as means for generating plasma inside the vacuum processing chamber and that feedback control is employed by measuring the sample temperature and controlling the heat transfer gas pressure.

A waveguide 32 is fitted to the upper part of the vacuum processing chamber 30 through an insulation window 31 so disposed as to face the sample bed 5. A magnetron 33 for generating microwaves is connected to the end portion of the waveguide 32. A solenoid coil 34 for generating a magnetic field inside the vacuum processing chamber 30 is fitted around the outer periphery of the vacuum processing chamber 30 above the sample bed 5. Reference numeral 35 represents a gas introduction pipe for introducing the processing gas into the vacuum processing chamber 30.

A temperature detection sensor 28 (such as a thermocouple, a fluorescent temperature detector) for detecting the temperature of the sample 6 from its back is disposed on the sample bed 5. The temperature detection sensor 28 is connected to the controller 29. The controller 29 receives a detection signal from the temperature detection sensor 28 and controls the flow rate regulator 16. The rest of the construction is the same as that of the embodiment described above.

Figure 5:
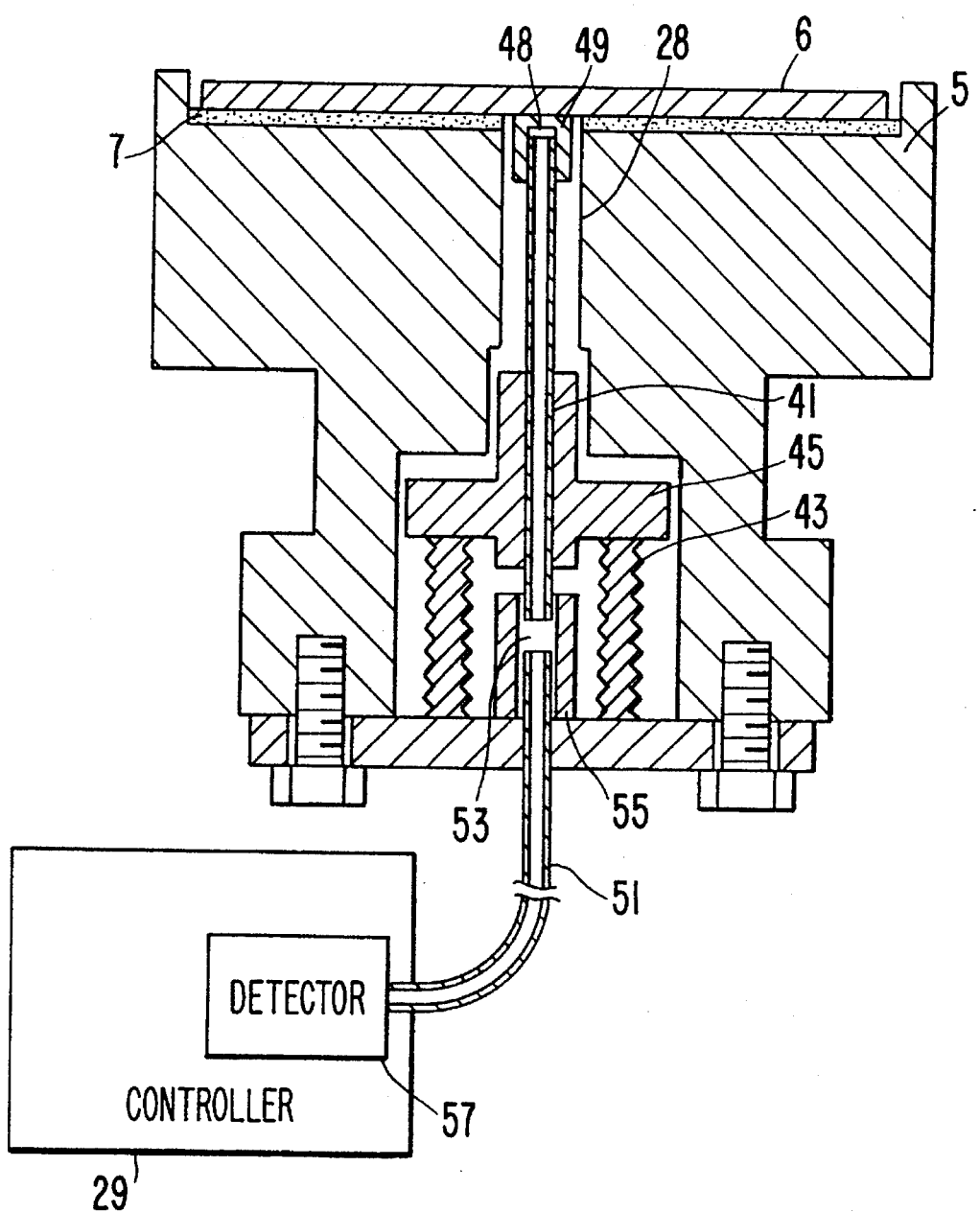
FIGS. 5 and 6 are structural views showing sample beds with temperature detectors.
Figure 6:
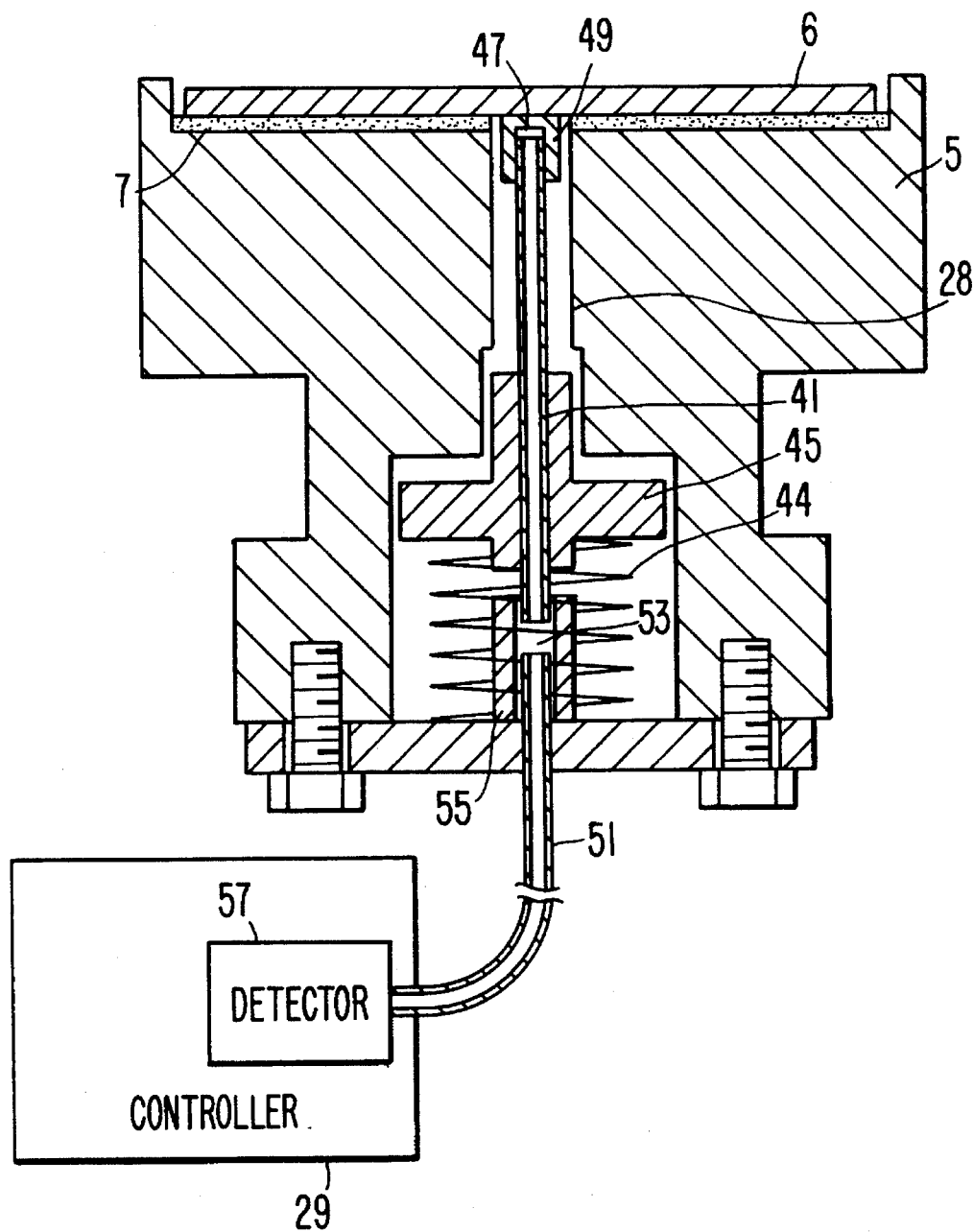

Though an example of the temperature detector of a phosphor type is disclosed in the Japanese Laid Open Patent 1992/58122, the temperature detector as shown in FIGS. 5 and 6 is superior to that in the Japanese laid open patent in order to achieve a precise thermal contact between the sample 6 and the phosphor 47. In FIGS. 5 and 6, the members unnecessary for temperature detection such as the pipe 10 and the gas supply line 15 are not shown. In FIG. 5 an optical fiber 41 is movable up and down by an actuator 43, since actuator 43 shifts up and down a circular calyx 45 fixed to a lower part of the optical fiber 41. A phosphor 47 which generates a fluorescence in accordance with a temperature thereof when a driving optical pulse is applied thereto is mounted on a top end of the optical fiber 41. The phosphor 47 is covered with protection cap 49 which can conduct the heat of the sample 6 to the phosphor 47. The fluorescence from the phosphor 47 is transferred to a bottom end of the movable fiber 41 therethrough. The fluorescence at the bottom end of the movable fiber 41 is transferred to a top end of a fixed optical fiber 51 through a space 53 in a cylindrical optical connector 55 and further transferred to the temperature detector 57 in the controller 29,. The driving optical pulse from the temperature detector 57 is transferred to the phosphor 47 through fibers 51 and 41. When the sample 6 is installed on the sample bed 5, before the installation, the fiber 41 is moved in the downward direction to make a space between the back surface of the sample 6 and the top surface of the cap 49. After the sample 6 is installed on the sample bed 5 and electrostatically held to the sample bed 5, the fiber 41 is moved in the upward direction to make thermal contact. In the structure of FIG. 5, since a movable part is limited to only a part (fiber 41) of whole fibers 41 and 51, the movable part is light in weight. Therefore, a position of the fiber 41 is intermitted from the fiber 51 by the space 53, a thermal leakage through the fiber 51 is prevented. Though the intensity of the fluorescence is decreased by the space 53, since the detection operation of the detector 55 is not affected by the intensity of the fluorescence if it is greater than the necessary amount, a detection error is not caused. As the actuator 43, various structure are applicable. It may be driven by a change of a pressure of a gas or a liquid or the change of shape of a member such as a shape memory alloy and a bi-metal structure or driven by an piezo-electrical element or a magnet. It may be replaced by a spring 44 as shown in FIG. 6. In this case, an elastic force of the spring 44 is selected to be a little bit smaller than the by weight of the sample 6.

In the apparatus having the construction as described above, the microwave is oscillated by the magnetron 33 and the magnetic field is generated by the solenoid coil 34, as shown in FIG. 3, so that the plasma of the processing gas is generated inside the vacuum processing chamber 30. After this plasma is generated, the D.C. voltage is applied to the sample bed 5 in the same way as in the first embodiment described already and the sample 6 is held electrostatically on the sample bed 5. The application of high frequency power to the sample bed 5 in the microwave etching apparatus is used for controlling the incidence of ions in the plasma to the sample 6. The heat transfer gas is supplied under the back of the sample 6 held on the sample bed 5 in the same way as in the first embodiment.

The controller 29 inputs the temperature detection signal detected by the temperature detection sensor 28 in this case, controls the flow rate regulator 16 so that the temperature of the sample 6 may be a predetermined set temperature, and controls also the heat transfer gas pressure on the back of the sample 6. The flow rate regulator 16 is controlled on the basis of the relation with the sample temperature in the same way as in the first embodiment.

Figure 4:
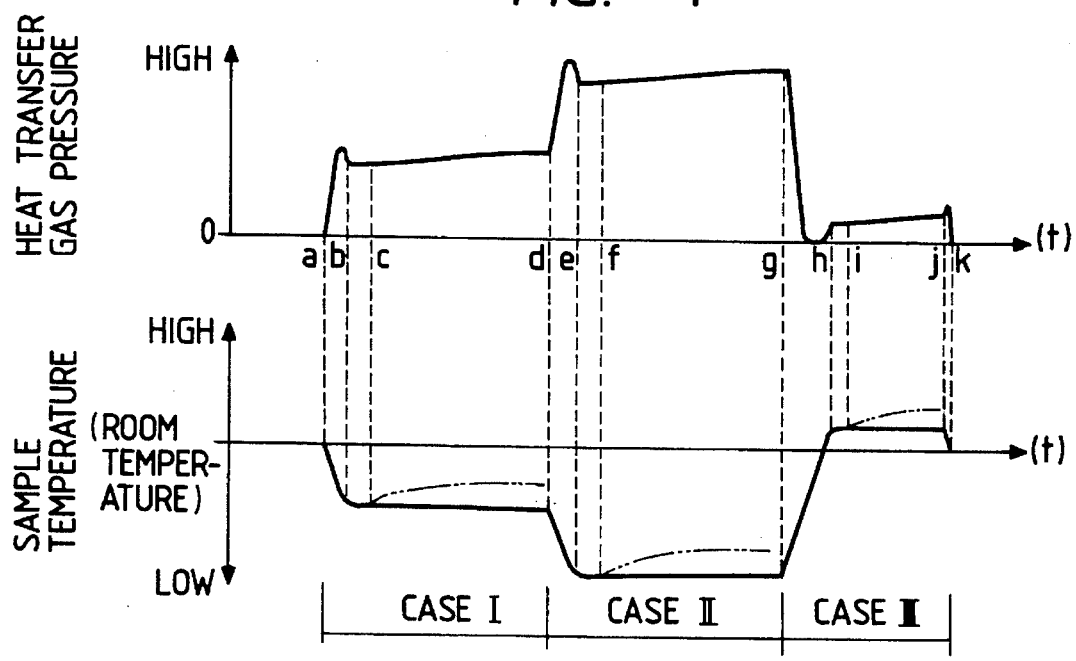
FIG. 4 is a diagram showing the relation between the temperature of a sample processed by the apparatus shown in FIG. 1 and the time necessary for the processing.

When the plasma processing is carried out, for example, by setting the sample temperature to a predetermined temperature lower than the room temperature as shown in FIG. 4 (Case I), the sample is rapidly cooled by increasing the heat transfer gas flow rate to the maximum in the region a-b so as to raise the pressure. The region b-c where the sample temperature reaches substantially the predetermined one, the heat transfer gas flow rate is lowered and stabilized.

In the region c-d where the plasma processing is started, the heat transfer gas pressure is controlled while detecting the sample temperature because there is the heat input to the sample due to the plasma processing. In this case, the heat transfer gas pressure rises gradually.

Next, in the case where the sample is subjected to the plasma processing at a predetermined further lower temperature after the processing of Case I (Case II), the processing can be carried out in the same way as in the Case I described above. The processing in the regions d-e, e-f and fog are carried out in the same way as in the regions a-b, b-c and c-d, respectively.

When the sample is processed by raising the temperature (Case III), on the contrary, the supply of the heat transfer gas is stopped in the region g-h and cooling of the sample is prevented by exhausting the remaining heat transfer gas. The sample is then heated by the radiant heat inside the vacuum processing chamber, or the like. In such a case where the temperature is set to be higher than the room temperature, a rapid temperature rise is made by utilizing the heat input from the plasma. In the region h-i where the sample temperature has reached substantially the predetermined one, the heat transfer gas flow rate is stabilized. In the region i-j where the plasma processing is started, the control is made in the same way as in the region c-d. When the plasma processing is completed and the sample temperature must be returned to the room temperature, the sample is cooled by raising the heat transfer gas pressure as in the region j-k.

This embodiment provides the same effects as those of the first embodiment, and makes it possible to conduct temperature control with higher accuracy because the heat transfer gas pressure is controlled while detecting the sample temperature.

According to the present invention, only the sample temperature can be changed without changing the temperature of the sample bed and consequently, the sample temperature can be quickly controlled to different temperatures.

What is claimed is:

1. A temperature detector for a sample comprising:

a movable optical fiber having one end at which a phosphor is mounted and another end, said movable optical fiber transferring a fluorescence from said phosphor to said another end, said fluorescence being changed in accordance with a temperature thereof;

a fixed optical fiber having a first end facing and spaced apart from said another end of said movable optical fiber for receiving said fluorescence and a second end to which said fluorescence is transferred through said fixed optical fiber;

a detector optically connected to said second end of said fixed optical fiber for detecting a temperature from said fluorescence received therein; and an actuating member for moving said movable optical fiber to a position wherein a thermal contact between said sample and said phosphor is made and thereby changing a distance between said another end of said movably optical fiber and said first end of said fixed optical fiber.

2. A temperature detector according to claim 1, further comprising a protection cap covering said phosphor at said one end of said movable optical fiber.

3. A temperature detector according to claim 1, wherein said actuating member is a spring.

4. A method for detecting the temperature of a sample mounted on a sample stand, comprising the steps of:

moving a movable optical fiber toward a back surface of the sample until a phosphor provided at one end of the movable optical fiber is in thermal contact with the sample by changing a distance between another end of the movable optical fiber and a first end of a fixed optical fiber;

transferring a fluorescence from the phosphor from the one end of the movable optical fiber through the movable optical fiber to the another end of the movable optical fiber;

transferring the fluorescence from the another end of the movable optical fiber to the first end of the fixed optical fiber separated from the another end of the movable optical fiber by a gap;

transferring the fluorescence from the first end of the fixed optical fiber to a second end of the fixed optical fiber;

detecting a temperature of the sample corresponding to the fluorescence with a detector optically connected to the second end of the fixed optical fiber.

* * * * *